us010871681B2

United States Patent
Nagasawa (10) Patent No.: US 10,871,681 B2
(45) Date of Patent: Dec. 22, 2020

(54) ELECTRO-OPTICAL DEVICE AND ELECTRONIC APPARATUS

(71) Applicant: SEIKO EPSON CORPORATION, Tokyo (JP)

(72) Inventor: Hitoya Nagasawa, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 129 days.

(21) Appl. No.: 16/037,701

(22) Filed: Jul. 17, 2018

(65) Prior Publication Data

US 2019/0033635 A1    Jan. 31, 2019

(30) Foreign Application Priority Data

Jul. 28, 2017 (JP) ................. 2017-146222

(51) Int. Cl.
| | |
|---|---|
| *G02F 1/1339* | (2006.01) |
| *G02F 1/1343* | (2006.01) |
| *G02F 1/133* | (2006.01) |
| *G02F 1/1333* | (2006.01) |
| *G02F 1/1362* | (2006.01) |

(Continued)

(52) U.S. Cl.
CPC .......... *G02F 1/1339* (2013.01); *G02F 1/0316* (2013.01); *G02F 1/1343* (2013.01); *G02F 1/13306* (2013.01); *G02F 1/133345* (2013.01); *G02F 1/133512* (2013.01); *G02F 1/136286* (2013.01); *H01L 27/124* (2013.01); *H01L 29/78633* (2013.01); *H01L 29/78648* (2013.01);

(Continued)

(58) Field of Classification Search
None
See application file for complete search history.

(56) References Cited

U.S. PATENT DOCUMENTS 6,274,887 B1 * 8/2001 Yamazaki ............... H01L 27/12
257/204
6,346,717 B1 * 2/2002 Kawata ............. H01L 29/78633
257/72

(Continued)

FOREIGN PATENT DOCUMENTS

| JP | H06-334185 A | 12/1994 |
|---|---|---|
| JP | 2001-284592 A | 10/2001 |

(Continued)

*Primary Examiner* — Edward J Glick
*Assistant Examiner* — Anthony G Quash
(74) *Attorney, Agent, or Firm* — Oliff PLC (57) ABSTRACT

Provided are an electro-optical device and an electronic apparatus enabling a channel length of a transistor provided in a peripheral circuit to be set to an appropriate dimension even when a region available for disposing the peripheral circuit has a reduced width. A plurality of N-channel type transistors formed in a scan line drive circuit of an electro-optical device each include a light-shielding layer, an insulating layer, a semiconductor layer, a gate insulating layer, and a gate electrode laminated one on another in order on the one surface side of a first substrate, and a slit overlapping a channel region in planer view extends in a channel width direction to the light-shielding layer. Therefore, in the semiconductor layer, step part reflecting a shape of each of end portions of the light-shielding layer via the insulating layer extend in the channel width direction in the channel region.

15 Claims, 9 Drawing Sheets (51) Int. Cl.
*H01L 29/786* (2006.01)
*H01L 27/12* (2006.01)
*H01L 27/092* (2006.01)
*H01L 27/108* (2006.01)
*G02F 1/1335* (2006.01)
*G02F 1/03* (2006.01)

(52) U.S. Cl.
CPC .. *H01L 29/78675* (2013.01); *H01L 29/78696* (2013.01)

(56) References Cited

U.S. PATENT DOCUMENTS

| | | | |
|---|---|---|---|
| 7,190,422 B2* | 3/2007 | Mochizuki | H01L 29/78633 349/44 |
| 2001/0030323 A1 | 10/2001 | Ikeda | |
| 2001/0038127 A1* | 11/2001 | Yamazaki | H01L 29/42384 257/359 |
| 2002/0158829 A1 | 10/2002 | Yamazaki et al. | |
| 2005/0282317 A1 | 12/2005 | Ikeda | |
| 2006/0113540 A1 | 6/2006 | Furuya | |
| 2006/0152665 A1 | 7/2006 | Murade | |
| 2006/0214239 A1 | 9/2006 | Shimada | |
| 2007/0206147 A1 | 9/2007 | Murade | |
| 2008/0198314 A1 | 8/2008 | Murade | |
| 2009/0102774 A1 | 4/2009 | Hattori | |
| 2010/0019175 A1* | 1/2010 | Nakata | H01L 29/66757 250/515.1 |
| 2012/0223311 A1 | 9/2012 | Endo | |
| 2012/0270375 A1 | 10/2012 | Sasagawa et al. | |
| 2015/0228799 A1 | 8/2015 | Koezuka et al. | |
| 2015/0277172 A1* | 10/2015 | Sekine | G02F 1/133512 349/43 |
| 2016/0163740 A1* | 6/2016 | Nakagawa | G02F 1/136286 349/46 |
| 2017/0053950 A1 | 2/2017 | Koezuka et al. | |
| 2018/0151603 A1 | 5/2018 | Koezuka et al. | |
| 2019/0172843 A1* | 6/2019 | Yoshida | G09G 3/20 |

FOREIGN PATENT DOCUMENTS

| | | |
|---|---|---|
| JP | 2002-328617 A | 11/2002 |
| JP | 2003-177427 A | 6/2003 |
| JP | 2003-243658 A | 8/2003 |
| JP | 2005-277323 A | 10/2005 |
| JP | 2006-154563 A | 6/2006 |
| JP | 2006-278358 A | 10/2006 |
| JP | 2009-103780 A | 5/2009 |
| JP | 2012-199525 A | 10/2012 |
| JP | 2015-188062 A | 10/2015 |
| JP | 2016-152143 A | 8/2016 |
| JP | 2016-187048 A | 10/2016 |
| JP | 2016-192580 A | 11/2016 |

* cited by examiner

ELECTRO-OPTICAL DEVICE AND ELECTRONIC APPARATUS

BACKGROUND

1. Technical Field

The disclosure relates to an electro-optical device in which unit circuits are formed at a pitch identical to a pitch of signal lines and an electronic apparatus.

2. Related Art

An electro-optical device such as a liquid crystal device includes pixels provided at respective intersections between a plurality of scan lines extending in a first direction and a plurality of data lines extending in a second direction. The pixels are provided with pixel transistors. The pixel transistors each include a light-shielding layer, an insulating layer, a semiconductor layer, a gate insulating layer, and a gate electrode laminated one on another in order on the one surface side of a substrate (refer to JP-A-2009-103780).

The plurality of scan lines are connected to a scan line drive circuit (peripheral circuit), and in the scan line drive circuit, a plurality of unit circuits respectively corresponding to the plurality of scan lines are provided along the second direction at a pitch identical to a pitch of the scan lines. In the scan line drive circuit, shift registers including a clocked inverter, an inverter, or the like includes a plurality of drive circuit transistors provided respectively in the plurality of unit circuits.

In the electro-optical device described in JP-A-2009-103780, when the pitch of the scan lines is reduced to achieve image definition enhancement or the like, a region available for disposing the unit circuits has a reduced width. For this reason, in the drive circuit transistor, a channel length inevitably reduces, and as a result, issues such as a decrease in threshold voltage of the drive circuit transistor and an increase in off-leakage current may occur.

The disclosure provides an electro-optical device and an electronic apparatus enabling a channel length of a transistor provided in a peripheral circuit to be set to an appropriate dimension, even when a region available for disposing the peripheral circuit has a reduced width.

SUMMARY

To address the issues described above, one aspect of an electro-optical device according to the disclosure includes a plurality of first signal lines extending along a first direction, a plurality of second signal lines extending along a second direction intersecting the first direction, a display region in which pixels are provided in correspondence with intersections between the plurality of first signal lines and the plurality of second signal lines, and a first peripheral circuit provided on one side in the first direction of the display region and including a plurality of first unit circuits that correspond to the plurality of first signal lines and are provided along the second direction at a pitch identical to pitches of the plurality of first signal lines. Pixel transistors provided in the pixels and a plurality of first transistors of a first conductivity type provided in the plurality of first unit circuits each include a light-shielding layer, an insulating layer, a semiconductor layer, a gate insulating layer, and a gate electrode laminated sequentially on a first surface side of a substrate, on which the plurality of first signal lines, the plurality of second signal lines, and the first peripheral circuit are provided, and among the plurality of first transistors, at least one of the plurality of first transistors includes a step part extending in a channel width direction in a channel region of the at least one of the plurality of first transistor, and the step part reflects a shape of an end portion of the light-shielding layer via the insulating layer.

In the disclosure, the pixel transistors formed in the pixels and the plurality of first transistors of a first conductivity type formed in the first unit circuits each include the light-shielding layer, the insulating layer, the semiconductor layer, the gate insulating layer, and the gate electrode laminated one on another in order on the one surface side of the substrate. Furthermore, among the plurality of first transistors, in the at least one of the first transistors, the step part reflecting the shape of the end portion of the light-shielding layer via the insulating layer extend in the channel width direction in the channel region. Therefore, in the at least one of the first transistors, since the channel region is curved in a thickness direction by the step part, a real dimension of the channel length is increased. For this reason, even when a region available for disposing the first unit circuits of the first peripheral circuit has a reduced width, a real dimension of the channel length can be set to an appropriate dimension with a length sufficient. Thus, in the first transistors, a decrease in threshold voltage, an increase in off-leakage current, and the like can be avoided.

In an aspect of the disclosure, in the plurality of first unit circuits, the plurality of first transistors may be arranged along the first direction with a channel length direction facing a direction along the second direction. According to such an aspect, the plurality of first transistors can be disposed efficiently. In this case, the channel length of each first transistor is likely to be affected by the pitch of the first signal lines, but according to the disclosure, even when the pitch of the first signal lines is reduced, a real dimension of the channel length of each first transistor can be set to an appropriate dimension.

In an aspect of the disclosure, the plurality of first signal lines may be each a scan line configured to transmit a scan signal, and the plurality of second signal lines may be each a data line configured to transmit an image signal.

In an aspect of the disclosure, in the semiconductor layer of the at least one of the plurality of first transistors, impurity concentration in a first region adjacent in the second direction to the channel region may be lower than impurity concentration in a second region adjacent to the first region on a side opposite to the channel region.

In an aspect of the disclosure, in the plurality of first unit circuits, a plurality of second transistors of a second conductivity type each including the insulating layer, the semiconductor layer, the gate insulating layer, and the gate electrode laminated sequentially may be arranged together with the plurality of first transistors along the first direction, and a channel length direction of each of the plurality of second transistor of the second conductivity type is arranged with a direction along the second direction.

In an aspect of the disclosure, in the first peripheral circuit, a shift register may include the plurality of first transistors and the plurality of second transistors.

In an aspect of the disclosure, a pitch in the second direction of the first signal lines may be less than or equal to 7 μm.

In an aspect of the disclosure, in the at least one of the plurality of first transistors, a slit provided in the light-shielding layer may extend in the channel width direction in a region overlapping the semiconductor layer in planer view, and the step part may be arranged in parallel in the channel length direction to reflect a shape of each of both end portions in the channel length direction of the slit via the insulating layer.

In an aspect of the disclosure, the at least one of the first transistors may have a channel length less than or equal to 2 μm in planer view, and a width of the light-shielding layer overlapping the channel region may be greater than or equal to 1 μm.

In an aspect of the disclosure, in the at least one of the plurality of first transistors, the light-shielding layer may extend in a belt shape in the channel width direction in a region overlapping the channel region in planer view, and the step part may be arranged in parallel in the channel length direction to reflect a shape of each of both end portions in the channel length direction of the light-shielding layer via the insulating layer.

In an aspect of the disclosure, the at least one of the first transistors may have a channel length less than or equal to 2 μm in planer view, and a width of the light-shielding layer overlapping the channel region may be greater than or equal to 1 μm.

In an aspect of the disclosure, in the at least one of the plurality of first transistors, a lower layer side insulating layer may be provided between the light-shielding layer and the substrate, and a lower layer side light-shielding layer may be provided between the lower layer side insulating layer and the substrate and overlaps across the semiconductor layer in planer view.

In an aspect of the disclosure, the electro-optical device may further include a second peripheral circuit provided on one side in the second direction of the display region and electrically connected to the plurality of second signal lines. In the second peripheral circuit, a plurality of second unit circuits corresponding to the plurality of second signal lines may be provided along the first direction at a pitch identical to pitches of the plurality of second signal lines, in the plurality of second unit circuits, a plurality of third transistors of a first conductivity type each including the light-shielding layer, the insulating layer, the semiconductor layer, the gate insulating layer, and the gate electrode laminated sequentially may be provided, and among the plurality of third transistors, in at least one of the third transistors, a step part reflecting a shape of an end portion of the light-shielding layer via the insulating layer may extend in the channel width direction in the channel region.

The electro-optical device to which the disclosure is applied can be used for various types of electronic apparatuses such as a direct-view type display device and a projection type display device. When the electronic apparatus is a projection type display device, the projection type display device includes a light source unit configured to emit light to be supplied to the electro-optical device, and a projection optical system configured to project light modulated by the electro-optical device.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Some exemplary embodiments of the disclosure will be described with reference to the drawings. Note that in each of the drawings referred to in the following description, each layer and each member are varied in scale to illustrate each layer and each member at a recognizable size on the drawings. Furthermore, when a layer formed on a first substrate is described, the upper layer side or the surface side means the side opposite to the side where a substrate main body of the first substrate is located (the side where a counter substrate and a liquid crystal layer are located), and the lower layer side means the side where the substrate main body of the first substrate is located. When a layer formed on a second substrate is described, the upper layer side or the surface side means the side opposite to the side where a substrate main body of a counter substrate is located (the side where the first substrate and the liquid crystal layer are located), and the lower layer side means the side where a substrate main body of the second substrate is located. Furthermore, in the disclosure, "planer view" means the appearance viewed in a direction normal to a first substrate 10 or a second substrate 20. These modes will be described mainly assuming that a first direction corresponds to an X direction and a second direction corresponds to a Y direction.

Exemplary Embodiment 1

Specific Configuration of Electro-Optical Device 100

Figure 1:
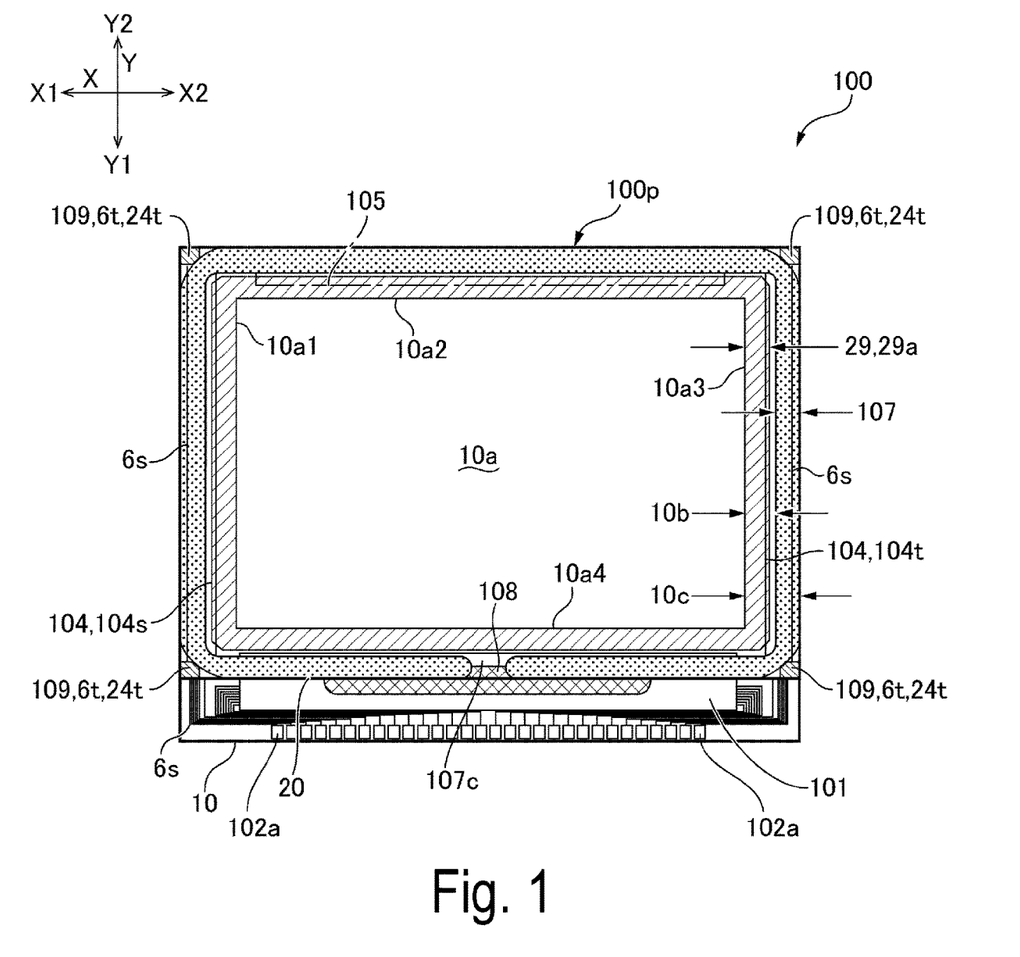
FIG. 1 is a plan view illustrating a configuration example of an electro-optical device according to Exemplary Embodiment 1 of the disclosure.
Figure 2:
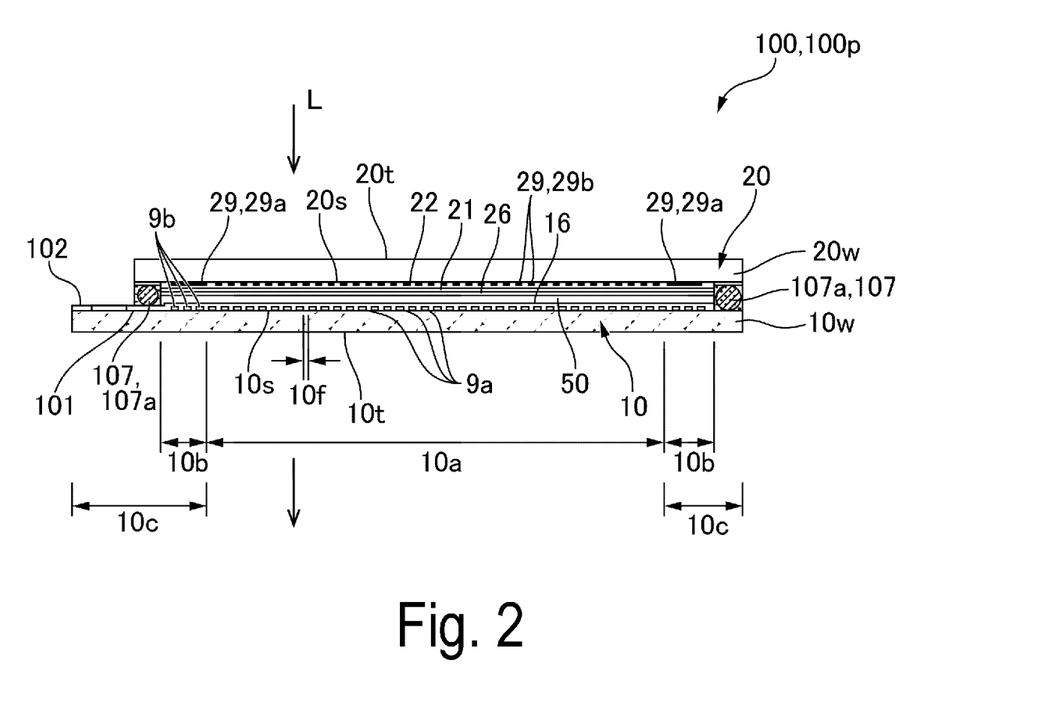
FIG. 2 is an explanatory view schematically illustrating a cross section of the electro-optical device illustrated in FIG. 1.

FIG. 1 is a plan view illustrating a configuration example of an electro-optical device 100 according to Exemplary Embodiment 1 of the disclosure. FIG. 2 is an explanatory view schematically illustrating a cross section of the electro-optical device 100 illustrated in FIG. 1. The electro-optical device 100 illustrated in FIG. 1 and FIG. 2 is a liquid crystal device, and includes a liquid crystal panel 100p. In the electro-optical device 100, a first substrate 10 and a second substrate 20 are bonded to each other with a sealing material 107 via a predetermined gap, and the sealing material 107 is provided in a frame shape along an outer edge of the second substrate 20. The sealing material 107 is an adhesive including a photocurable resin, a thermosetting resin, or the like, and is blended with a gap material 107a such as glass fiber or glass beads used for setting a distance between both the substrates to a predetermined value. In the liquid crystal panel 100p, an electro-optical layer 50 including a liquid crystal layer is provided within a region located between the first substrate 10 and the second substrate 20 and surrounded by the sealing material 107. The sealing material 107 includes an interrupted part 107c used as a liquid crystal injection port, and the interrupted part 107c is closed by a sealing material 108 after injection of a liquid crystal material. Note that when the liquid crystal material is enclosed by a drip method, the interrupted part 107c is not formed.

The first substrate 10 and the second substrate 20 each have a square shape, and a display region 10a is provided as a square region substantially at the center of the electro-optical device 100. The sealing material 107 is also provided in substantially a square shape corresponding to such a shape, and the outside of the display region 10a is an outer peripheral region 10c having a square frame-like shape.

The first substrate 10 includes a scan line drive circuit 104 (first peripheral circuit) formed in the outer peripheral region 10c along a first side 10a1 located on one side Z1 in a first direction X of the display region 10a. The first substrate 10 includes a plurality of terminals 102 formed in an end portion on the side protruding from the second substrate 20 to one side Y1 in a second direction Y, and an inspection circuit 105 provided in the outer peripheral region 10c along a second side 10a2 on the side opposite to the terminals 102 in the second direction Y of the display region 10a. Furthermore, the first substrate 10 includes a scan line drive circuit 104 formed in the outer peripheral region 10c along a third side 10a3 facing the first side 10a1 in the first direction X. Accordingly, the scan line drive circuit 104 includes scan line drive circuits 104s and 104t on one side X1 and the other side X2 in the X direction of the display region 10a. Furthermore, the first substrate 10 includes a data line drive circuit 101 (second peripheral circuit) formed in the outer peripheral region 10c along a fourth side 10a4 facing the second side 10a2 in the second direction Y.

The first substrate 10 includes a substrate main body 10w having a light transmission property such as a quartz substrate and a glass substrate, and among one surface 10s and the other surface 10t of the first substrate 10 (substrate main body 10w), on the one surface 10s side facing the second substrate 20, a plurality of pixel transistors and pixel electrodes 9a electrically connected to the respective plurality of pixel transistors are formed in a matrix pattern in the display region 10a. A first alignment film 16 is formed on the upper layer side of the pixel electrodes 9a. On the one surface 10s side of the first substrate 10, dummy pixel electrodes 9b formed at the same time as the pixel electrodes 9a are formed at a portion extending along a side of the display region 10a in a frame-shaped region 10b having a square shape and extending between the outer edge of the display region 10a and the sealing material 107 in the outer peripheral region 10c.

The second substrate 20 includes a substrate main body 20w having a light transmission property such as a quartz substrate and a glass substrate, and among one surface 20s and the other surface 20t of the second substrate 20 (substrate main body 20w), a common electrode 21 is formed on the one surface 20s side facing the first substrate 10. The common electrode 21 is formed substantially entirely on a surface of the second substrate 20 or formed as a plurality of belt-shaped electrodes in a region straddling and encompassing a plurality of pixels 100a. In one exemplary embodiment, the common electrode 21 is formed substantially entirely on the surface of the second substrate 20.

On the one surface 20s side of the second substrate 20, the frame-shaped region 10b includes a light-shielding layer 29 formed on the lower layer side of the common electrode 21, and a second alignment film 26 is laminated on a surface on the electro-optical layer 50 side of the common electrode 21. A planarizing film 22 having a light transmission property is formed between the light-shielding layer 29 and the common electrode 21. The light-shielding layer 29 is formed as a parting light-shielding layer 29a extending along the frame-shaped region 10b, and an inner edge of the parting light-shielding layer 29a defines the display region 10a. The light-shielding layer 29 is also formed as a black matrix part 29b overlapping an inter-pixel region 10f sandwiched between the pixel electrodes 9a adjacent to each other. The parting light-shielding layer 29a is formed at a position overlapping the dummy pixel electrodes 9b in planar view, and an outer peripheral edge of the parting light-shielding layer 29a is present at a position separated by a gap from an inner peripheral edge of the sealing material 107. Accordingly, the parting light-shielding layer 29a and the sealing material 107 do not overlap. The parting light-shielding layer 29a (light-shielding layer 29) includes a light-shielding metal film, a black colored resin, or the like.

The first alignment film 16 and the second alignment film 26 are inorganic alignment films each including an oblique vapor deposition film such as $SiO_x$ ($x \leq 2$), $TiO_2$, MgO, and $Al_2O_3$, and include columnar structure layers in which columnar bodies called columns are formed on the skew relative to the first substrate 10 and the second substrate 20. Accordingly, in the first alignment film 16 and the second alignment film 26, nematic liquid crystal molecules having negative dielectric anisotropy and used in the electric-optical layer 50 are oriented on the skew relative to the first substrate 10 and the second substrate 20, and the liquid crystal molecules are given a pre-tilt. Thus, the electro-optical device 100 is configured as a normally black VA (vertical alignment) mode liquid crystal device.

In the electro-optical device 100, inter-substrate conduction electrodes 24t are formed at four corners on the one surface 20s side of the second substrate 20 outside the sealing material 107, and inter-substrate conduction electrodes 6t are formed at positions facing the four corners of the second substrate 2 (inter-substrate conduction electrodes 24t) on the one surface 10s side of the first substrate 10. The inter-substrate conduction electrodes 6t are conducted to a common electric potential line 6s, and the common electric potential line 6s is conducted to a terminal 102a for applying a common electric potential among the terminals 102. An inter-substrate conductive material 109 including conductive particles is disposed between the inter-substrate conduction electrodes 6t and the inter-substrate conduction electrodes 24t, and the common electrode 21 of the second substrate 20 is electrically connected to the first substrate 10 side via the inter-substrate conduction electrodes 6t, the inter-substrate conductive material 109, and the inter-substrate conduction electrodes 24t. Therefore, the common electrode 21 has a common electric potential applied from the first substrate 10 side.

The electro-optical device 100 of one exemplary embodiment is a transmissive liquid crystal device. Accordingly, the pixel electrodes 9a and the common electrode 21 are formed of a light-transmissive conductive film such as an indium tin oxide (ITO) film and an indium zinc oxide (IZO) film. In such an electro-optical device 100 (transmissive liquid crystal device), light source light L having entered from the second substrate 20 side is modulated while the light source light L exits from the first substrate 10, and then an image is displayed.

The electro-optical device 100 is used as a color display device of an electronic apparatus such as a mobile computer and a portable telephone, and in this case, a color filter (not illustrated) is formed on the second substrate 20 or the first substrate 10. Furthermore, the electro-optical device 100 is used as an RGB light bulb in a projection type display device (liquid crystal projector) described below. In this case, for example, light of each color separated by a dichroic mirror for RGB color separation enters each electro-optical device 100 for RGB as projection light, and therefore, the color filter is not formed.

Electrical Configuration of Electro-Optical Device 100

Figure 3:
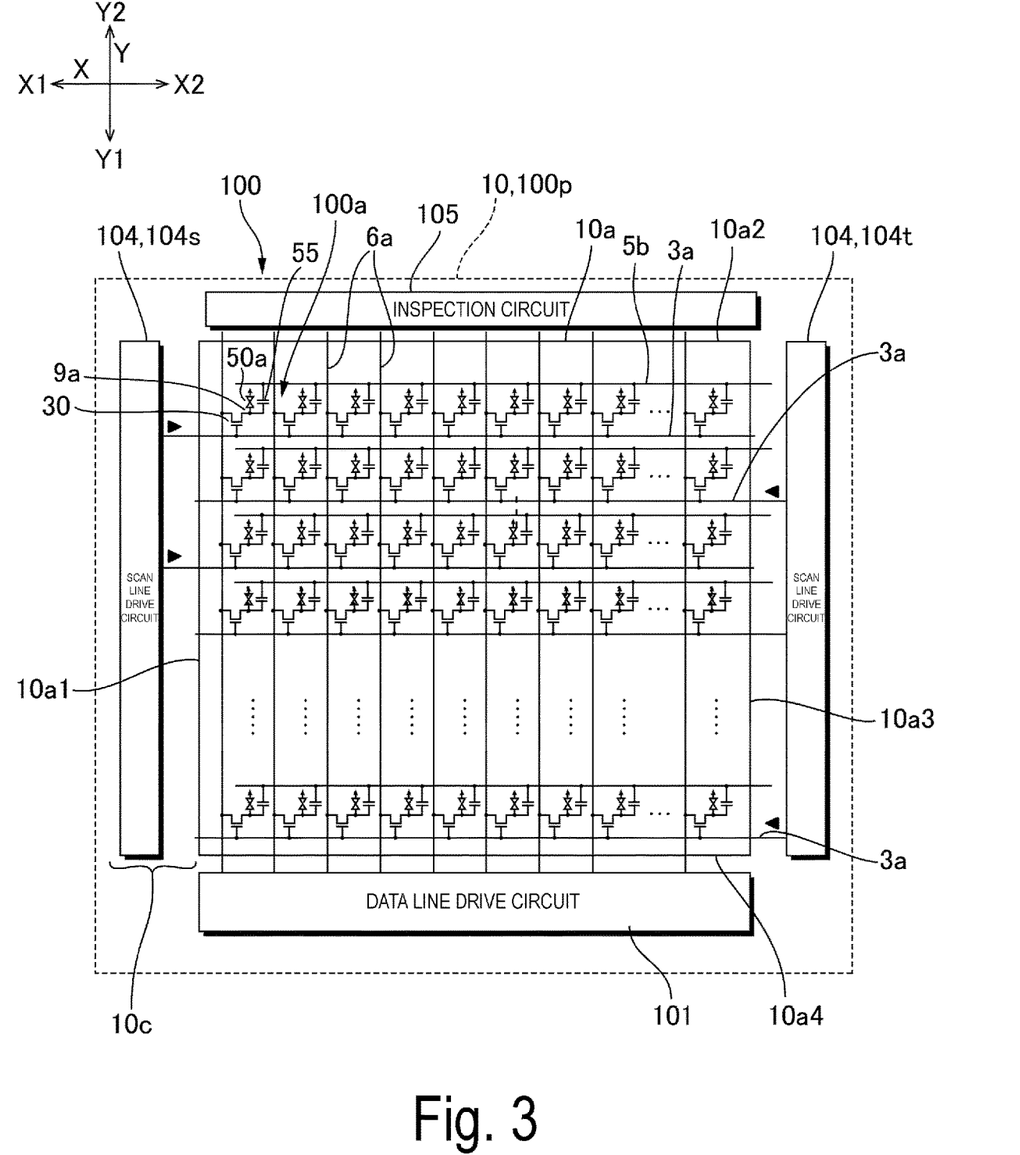
FIG. 3 is a block diagram illustrating an electrical configuration of the electro-optical device illustrated in FIG. 1.

FIG. 3 is a block diagram illustrating an electrical configuration of the electro-optical device 100 illustrated in FIG. 1. In FIG. 3, the electro-optical device 100 includes a liquid crystal panel 100p of a VA mode, and the liquid crystal panel 100p includes a central region including the display region 10a in which the plurality of pixels 100a are arranged in a matrix pattern. In the liquid crystal panel 100p, the first substrate 10 described with reference to FIG. 1, FIG. 2, and the like includes a plurality of scan lines 3a (first signal lines) formed inside the display region 10a and extending in the X direction, and a plurality of data lines 6a (second signal lines) formed inside the display region 10a and extending in the Y direction, and the plurality of pixels 100a are provided inside the display region 10a in correspondence with intersections of the plurality of scan lines 3a and the plurality of data lines 6a. The plurality of scan lines 3a are electrically connected to the scan line drive circuit 104, and the plurality of data lines 6a are connected to the data line drive circuit 101. Furthermore, the plurality of data lines 6a are electrically connected to the inspection circuit 105 on the side opposite in the second direction Y to the data line drive circuit 101. A pixel transistor 30 including a field effect transistor or the like, and the pixel electrode 9a electrically connected to the pixel transistor 30 is formed in each of the plurality of pixels 100a. The data lines 6a are electrically connected to sources of the pixel transistors 30, the scan lines 3a are electrically connected to gates of the pixel transistors 30, and the pixel electrodes 9a are electrically connected to drains of the pixel transistors 30. An image signal is supplied to the data lines 6a, and a scan signal is supplied to the scan lines 3a. In this mode, the scan line drive circuit 104 includes scan line drive circuits 104s and 104t on the one side X1 and the other side X2 in the X direction of the display region 10a, and the scan line drive circuit 104s on the one side X1 in the X direction drives the odd-numbered scan lines 3a, and the scan line drive circuit 104t on the other side X2 in the X direction drives the even-numbered scan lines 3a.

In each of the pixels 100a, the pixel electrodes 9a face the common electrode 21 of the second substrate 20 described with reference to FIG. 1 and FIG. 2 via the electro-optical layer 50 and constitute liquid crystal capacitance 50a. In each of the pixels 100a, storage capacitance 55 is added in parallel to the liquid crystal capacitance 50a to prevent fluctuations in an image signal held by the liquid crystal capacitance. In this embodiment, to constitute the storage capacitance 55, capacitance lines 5b extending across the plurality of pixels 100a are formed on the first substrate 10, and a common electric potential is supplied to the capacitance lines 5b. In one embodiment, the capacitance lines 5b extend in the first direction X along the scan lines 3a.

Specific Configuration of Pixels 100a

Figure 4:
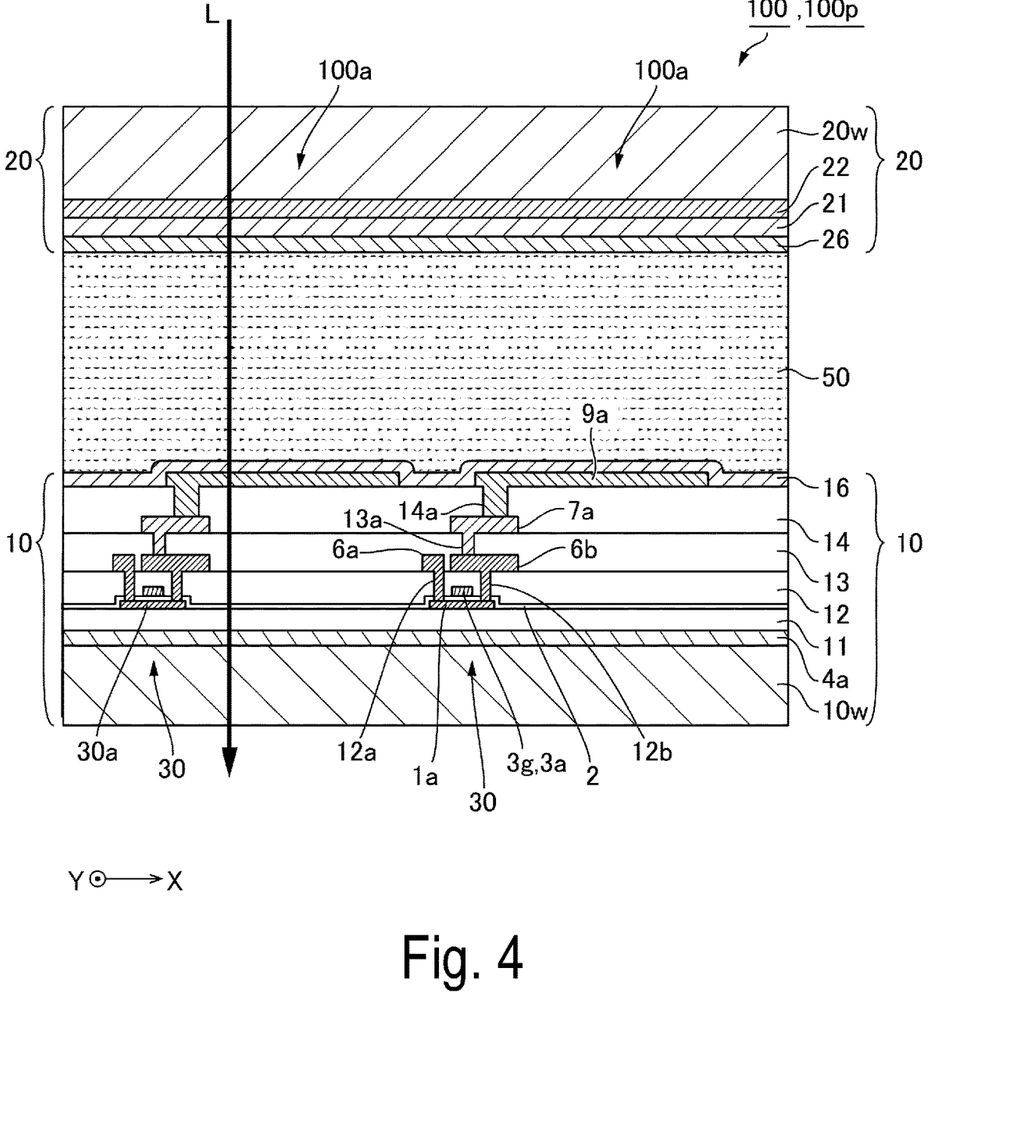
FIG. 4 is a cross-sectional diagram schematically illustrating a configuration example of pixels in a liquid crystal device illustrated in FIG. 1.

FIG. 4 is a cross-sectional diagram schematically illustrating a configuration example of the pixels 100a of the electro-optical device 100 illustrated in FIG. 1. As illustrated in FIG. 4, the one surface 10s side of the first substrate 10 includes the pixel transistor 30 including a thin film transistor including an insulating layer 11, a semiconductor layer 1a, a gate insulating layer 2, and a gate electrode 3g laminated one on another in order on the one surface 10s side. More specifically, the one surface 10s of the first substrate 10 includes a light-shielding layer 4a including a conductive film such as a conductive polysilicon film, a metal silicide film, a metal film, or a metal compound film. In this exemplary embodiment, the light-shielding film 4a includes a light-shielding film such as tungsten silicide (WSi). An insulating layer 11 having a light transmission property is formed on the upper layer side of the light-shielding layer 4a, and the pixel transistor 30 including the semiconductor layer 1a is formed on the surface side of the insulating layer 11. In one exemplary embodiment, the insulating layer 11 includes a silicon oxide film or the like.

The pixel transistor 30 includes the semiconductor layer 1a, and the scan lines 3a (gate electrode 3g) intersecting the semiconductor layer 1a, and includes a gate insulating layer 2 having a light transmission property between the semiconductor layer 1a and the gate electrode 3g. The semiconductor layer 1a includes a polysilicon film (polycrystalline silicon film) or the like. In this exemplary embodiment, the pixel transistor 30 is an N-channel type (first conductivity type) thin film transistor including an LDD structure. The gate insulating layer 2 includes a two layer structure of a first gate insulating layer including a silicon oxide film obtained by thermally oxidizing the semiconductor layer 1a and a second gate insulating layer including a silicon oxide film formed by a low pressure CVD method or the like. Note that the light-shielding layer 4a may be the scan lines 3a, and the gate electrode 3g may be connected electrically to the light-shielding layer 4a (scan lines 3a) via a contact hole (not illustrated) penetrating the gate insulating layer 2 and the insulating layer 11.

Interlayer insulating films 12, 13, and 14 (a plurality of insulating layers) having a light transmission property and each including a silicon oxide film or the like are formed in order on the upper layer side of the gate electrode 3g, and gaps among the interlayer insulating films 12, 13, and 14 are used to constitute the storage capacitance 55 described with reference to FIG. 3. In this exemplary embodiment, the data lines 6a and a drain electrode 6b are formed between the interlayer insulating film 12 and the interlayer insulating film 13, and a relay electrode 7a is formed between the interlayer insulating film 13 and the interlayer insulating film 14. The data lines 6a are electrically connected to a source region of the semiconductor layer 1a via a contact hole 12a penetrating the interlayer insulating film 12 and the gate insulating layer 2. The drain electrode 6b is electrically connected to a drain region of the semiconductor layer 1a via a contact hole 12b penetrating the interlayer insulating film 12 and the gate insulating layer 2. The relay electrode 7a is electrically connected to the drain electrode 6b via a contact hole 13a penetrating the interlayer insulating film 13. The interlayer insulating film 14 includes a flat surface, and the pixel electrodes 9a are formed on the surface side of the interlayer insulating film 14 (surface side on the electro-optical layer 50 side). The pixel electrodes 9a are conducted to the relay electrode 7a via a contact hole 14a penetrating the interlayer insulating film 14. Accordingly, the pixel electrodes 9a are electrically connected to a drain region of the pixel transistor 30 via the relay electrode 7a and the drain electrode 6b.

Detailed Configuration of Scan Line Drive Circuit 104

Figure 5:
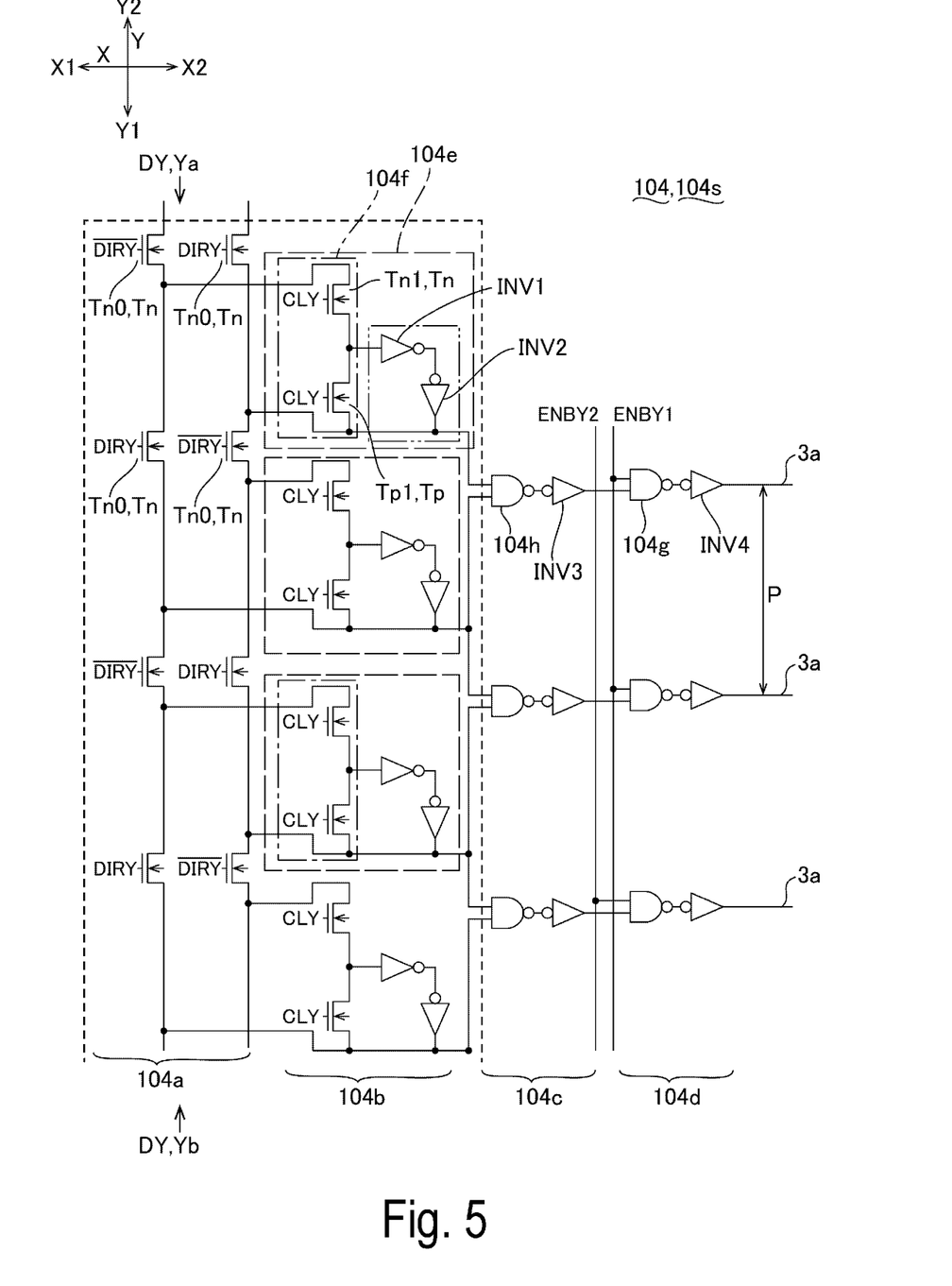
FIG. 5 is an explanatory view illustrating a part of a circuit configuration of a scan line drive circuit illustrated in FIG. 3.

FIG. 5 is an explanatory view illustrating a part of a circuit configuration of the scan line drive circuit 104 illustrated in FIG. 3. Note that in one mode, the scan line drive circuit 104 is formed as the scan line drive circuits 104s and 104t on both the sides in the X direction of the display region 10a, but the scan line drive circuits 104s and 104t are identical in configuration. Accordingly, the scan line drive circuit 104s will be described mainly, and description of the scan line drive circuit 104t will be omitted. As illustrated in FIG. 5, the scan line drive circuit 104 includes a transfer direction control circuit 104a, a shift register 104b, a first logic circuit 104c including an NAND circuit 104h and an inverter INV3, and a second logic circuit 104d (buffer circuit) including an NAND circuit 104g and an inverter INV4. The transfer direction control circuit 104a includes N-channel type transistors Tn0 connected in two-system series, and a transfer direction control signal DIRY and an inverted transfer direction control signal DIRY bar are alternately supplied to gates of the N-channel type transistors Tn0. When the inverted transfer direction control signal DIRY bar is at an H level, the N-channel type transistors Tn0 supplied with the inverted transfer direction control signal DIRY bar are turned on, while the N-channel type transistors Tn0 supplied with the transfer direction control signal DIRY are turned off. Therefore, a start pulse DY is transferred in an arrow Ya direction, and as a result, scan signals are supplied in order from top to bottom to a plurality of scan lines 31. In contrast, when the inverted transfer direction control signal DIRY bar is at an L level, the N-channel type transistors Tn0 to be turned on and the N-channel type transistors Tn0 to be turned off are inverted. In this case, the start pulse DY is transferred in an arrow Yb direction, and as a result, scan signals are supplied in order from top to bottom to the plurality of scan lines 31.

The shift register 104b includes a plurality of unit circuits 104e (first unit circuits) corresponding to the plurality of scan lines 3a to which the scan line drive circuit 104 (scan line drive circuit 104s) is connected. The plurality of unit circuits 104e each include a clocked inverter 104f including an N-channel type transistor Tn1 supplied with a clock signal CLY and a P-channel type transistor Tp1 supplied with a clock signal CLY, and two inverters INV1 and INV2. During an H level period of the clock signal CLY, the N-channel type transistor Tn1 is turned on, and signals are transferred via the two inverters INV1 and INV2. Next, when the clock signal CLY changes to be at an L level, the P-channel type transistor Tp1 is turned on, and therefore the P-channel type transistor Tp1 and the inverters INV1 and INV2 constitute a latch circuit. Accordingly, a logic level of an output signal is maintained even during an L level period of the clock signal CLY.

In the first logic circuit 104c, an output signal from two of the unit circuits 104e adjacent to each other in the Y direction is input to the NAND circuit 104h.

In the second logic circuit 104d, an output from the corresponding first logic circuit 104c and an enable signal ENBY1 (or an enable signal ENBY2) are input to the NAND circuit 104g, and the second logic circuit 104d outputs a signal corresponding to a logical sum of the output from the first logic circuit 104c and the enable signal ENBY1 (or the enable signal ENBY2) as a scan signal to the scan lines 3a.

Configuration of Drive Circuit Transistor

Figure 6:
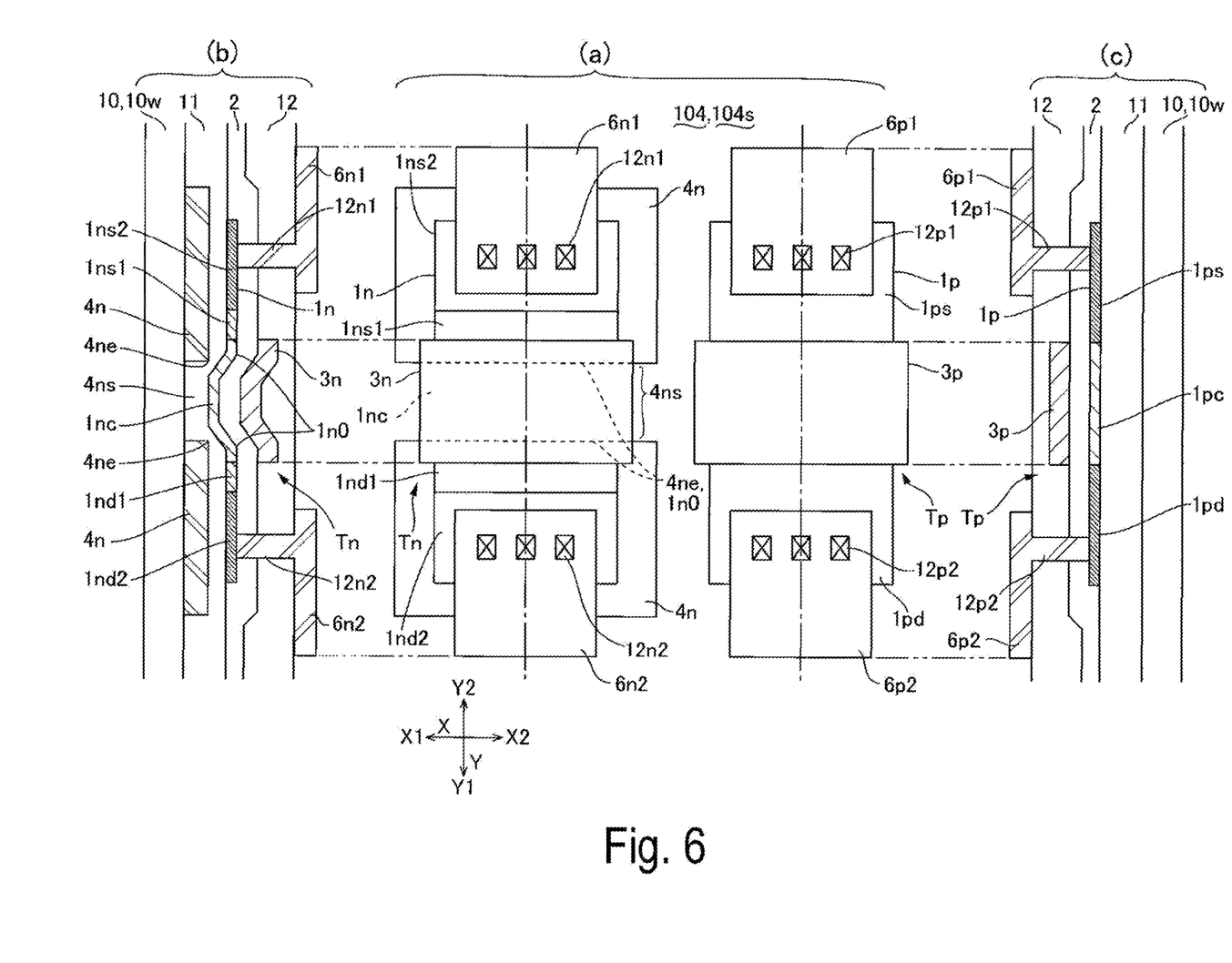
FIG. 6 is an explanatory view of an N-channel type transistor (first transistor) and a P-channel type transistor (second transistor) formed in the scan line drive circuit illustrated in FIG. 5.

FIG. 6 is an explanatory view of the N-channel type transistor Tn (first transistor) and the P-channel type transistor Tp (second transistor) formed in the scan line drive circuit 104 illustrated in FIG. 5, and FIG. 6 illustrates a plan view (a) of the N-channel type transistor Tn (first transistor) and the P-channel type transistor Tp (second transistor) in the middle, a cross-sectional diagram (b) of the N-channel type transistor Tn (first transistor) on the left side, and a cross-sectional diagram (c) of the P-channel type transistor Tp (second transistor) on the right side.

In the scan line drive circuit 104 illustrated in FIG. 5, the clocked inverter 104f and the inverters INV1 and INV2 of the unit circuits 104e each include a plurality of the N-channel type (first conductivity type) transistors Tn (first transistors) and a plurality of the P-channel type (second conductivity type) transistors Tp (second transistors). Furthermore, the transfer direction control circuit 104a, the first logic circuit 104c, and the second logic circuit 104d also each include the plurality of N-channel type transistors Tn (first transistors) and the plurality of P-channel type transistors Tp (second transistors).

In one mode, as illustrated in FIG. 5, the transistors (the plurality of N-channel type transistors Tn, and the plurality of P-channel type transistors Tp) constituting the transfer direction control circuit 104a, the unit circuits 104e, the first logic circuit 104c, and the second logic circuit 104d are arranged along the X direction (an extension direction of the scan lines 3a).

Furthermore, the transistors (the plurality of N-channel type transistors Tn, and the plurality of P-channel type transistors Tp) constituting the transfer direction control circuit 104a, the unit circuits 104e, the first logic circuit 104c, and the second logic circuit 104d each have a channel length direction oriented to a direction along the Y direction (a direction intersecting the scan lines 3a, an extension direction of the data lines 6a).

Furthermore, as with the pixel transistor 30 illustrated in FIG. 4, the plurality of N-channel type transistors Tn and the plurality of P-channel type transistors Tp each include semiconductor layers $1n$ and $1p$ in the same layer as the semiconductor layer 1a on the side opposite to the first substrate 10 of the insulating layer 11, a gate insulating layer 2, and gate electrodes $3n$ and $3p$.

Here, as illustrated in FIG. 6, at least one of the plurality of N-channel type transistors Tn includes a light-shielding layer $4n$ in the same layer as the light-shielding layer 4a between the insulating layer 11 and the first substrate 10. In this mode, the plurality of N-channel type transistors Tn each include the light-shielding layer $4n$ in the same layer as the light-shielding layer 4a between the insulating layer 11 and the first substrate 10. Accordingly, the plurality of N-channel type transistors Tn each include the light-shielding layer $4n$, the insulating layer 11, the semiconductor layer $1n$, the gate insulating layer 2, and the gate electrode $3n$ laminated one on another in order on the one surface side of the first substrate 10.

Furthermore, the plurality of N-channel type transistors Tn each include an LDD structure. Therefore, in the semiconductor layer $1n$, impurity concentration in first regions $1ns1$ and $1nd1$ (LDD regions) adjacent in the Y direction to a channel region $1nc$ is lower than impurity concentration in second regions $1ns2$ and $1nd2$ adjacent to the first regions $1ns1$ and $1nd1$ on the side opposite to the channel region $1nc$. Accordingly, electrodes $6n1$ and $6n2$ (a source electrode and a drain electrode) are electrically connected via contact holes $12n1$ and $12n2$ of the interlayer insulating film 12 to the second regions 1ns2 and 1nd2 into which impurities at a high concentration are introduced.

Here, in the semiconductor layer 1n, step part 1n0 reflecting a shape of each of end portions 4ne of the light-shielding layer 4n via the insulating layer 11 extend in the channel width direction in the channel region 1nc. More specifically, in the N-channel type transistor Tn, the light-shielding layer 4n is formed to overlap the first regions 1ns1 and 1nd1 and the second regions 1ns2 and 1nd2 in planer view, but a slit 4ns extending in the channel width direction to a region overlapping the channel region 1nc in planer view is formed in the light-shielding layer 4n. Therefore, the shape of each of the end portions 4ne of the light-shielding layer 4n in both end portions in the channel length direction of the slit 4ns is reflected by the semiconductor layer 1n via the insulating layer 11, and in the semiconductor layer 1n, the step part 1n0 is arranged in parallel in two columns in the channel length direction.

In one mode, a pitch in the Y direction of the unit circuits 104e or the like in the scan line drive circuit 104 is equal to a pitch P of the scan lines 3a connected to the scan line drive circuit 104 (scan line drive circuit 104s) (refer to FIG. 5). Furthermore, in this mode, as a result of narrowing of the pitch of the scan lines 3a, the pitch in the Y direction of the unit circuits 104e or the like and the pitch P of the scan lines 3a are each less than or equal to 7 µm, and the N-channel type transistor Tn has a channel length of less than or equal to 2 µm in planer view. Here, a width of the slit 4ns overlapping the channel region 1nc is greater than or equal to 1 µm. Accordingly, the N-channel type transistor Tn has a channel length less than or equal to 2 µm in planer view, but since the channel region 1nc is curved in a thickness direction by the step part 1n0 formed by the slit 4ns, a real dimension of the channel length is greater than 2 µm. For example, when the width of the slit 4ns is 1 µm, a real channel length of the channel region 1nc increases by 0.23 to 0.25 µm.

Meanwhile, as illustrated in FIG. 5, the plurality of P-channel type transistors Tp each include no light-shielding layer in the same layer as the light-shielding layer 4a formed between the insulating layer 11 and the first substrate 10, and the P-channel type transistors Tp each include the insulating layer 11, the semiconductor layer 1n, the gate insulating layer 2, and the gate electrode 3n laminated one on another in order on the one surface side of the first substrate 10. Furthermore, the plurality of P-channel type transistors Tp each include a self-alignment structure. Therefore, in the semiconductor layer 1p, regions 1ps and 1pd adjacent in the Y direction to the channel region 1pc are high concentration impurity introduction regions, and electrodes 6p1 and 6p2 (a source electrode and a drain electrode) are electrically connected via contact holes 12p1 and 12p2 of the interlayer insulating film 12 to the regions 1ps and 1pd into which impurities at a high concentration are introduced.

In such a plurality of P-channel type transistors Tp, fluctuations in threshold voltage and an increase in off-leakage current are inherently unlikely to occur even when the channel length is reduced. Accordingly, even when the channel length is set to be less than or equal to 2 µm in planer view in correspondence with the pitch in the Y direction of the unit circuits 104e or the like being less than or equal to 7 µm, fluctuations in threshold voltage and an increase in off-leakage current are unlikely to occur. Therefore, the configuration in which the light-shielding layer is used to increase a real dimension of the channel length may not be adopted.

However, as with the plurality of N-channel type transistors Tn, as for the plurality of P-channel type transistors Tp, the step part caused by the light-shielding layer may increase a real dimension of the channel length. Furthermore, as for the plurality of P-channel type transistors Tp, the light-shielding layer may be formed to entirely overlap the semiconductor layer 1p in planer view to suppress malfunctioning due to optical leakage current due to light entering from the first substrate 10 side.

Main Effects of this Mode

As described above, in this mode, the pixel transistors 30 formed in the pixels 100a and the plurality of N-channel type (first conductivity type) transistors Tn (first transistors) formed in the unit circuits 104e (first unit circuits) of the scan line drive circuit 104 (first peripheral circuit) each include the light-shielding layers 4a and 4n, the insulating layer 11, the semiconductor layers 1a and 1n, the gate insulating layer 2, and the gate electrodes 3g and 3n laminated one on another in order on the one surface side of the first substrate 10. Furthermore, in the plurality of N-channel type transistors Tn, the step part 1n0 reflecting the shape of each of the end portions 4ne of the light-shielding layer 4n via the insulating layer 11 extend in the channel width direction in the channel region 1nc. Therefore, in the plurality of N-channel type transistors Tn, since the channel region 1nc is curved in the thickness direction by the step part 1n0, a real dimension of the channel length is increased. For this reason, even when a region available for disposing the unit circuits 104e of the scan line drive circuit 104 has a reduced width, a real dimension of the channel length of each of the plurality of transistors Tn provided in the unit circuits 104e is set to an appropriate dimension with a length sufficient. Thus, even when the channel length is set to less than or equal to 2 µm in planer view, fluctuations in threshold voltage and an increase in off-leakage current are unlikely to occur.

In particular, in one mode, since each of the transistors is arranged along the X direction with the channel length direction facing the direction along the Y direction, the plurality of transistors are efficiently disposed. On the other hand, the channel length is likely to be affected by the pitch of the scan lines 3a in the N-channel type transistors Tn, but according to one mode, even when the pitch of the scan lines 3a is reduced, a real dimension of the channel length of each of the plurality of N-channel type transistors Tn is set to an appropriate dimension with a length sufficient.

Furthermore, the light-shielding layer 4n is subjected to film formation and patterning at the same time as the light-shielding layer 4a of the display region 10a.

Accordingly, there is no additional step.

Exemplary Embodiment 2

Figure 7:
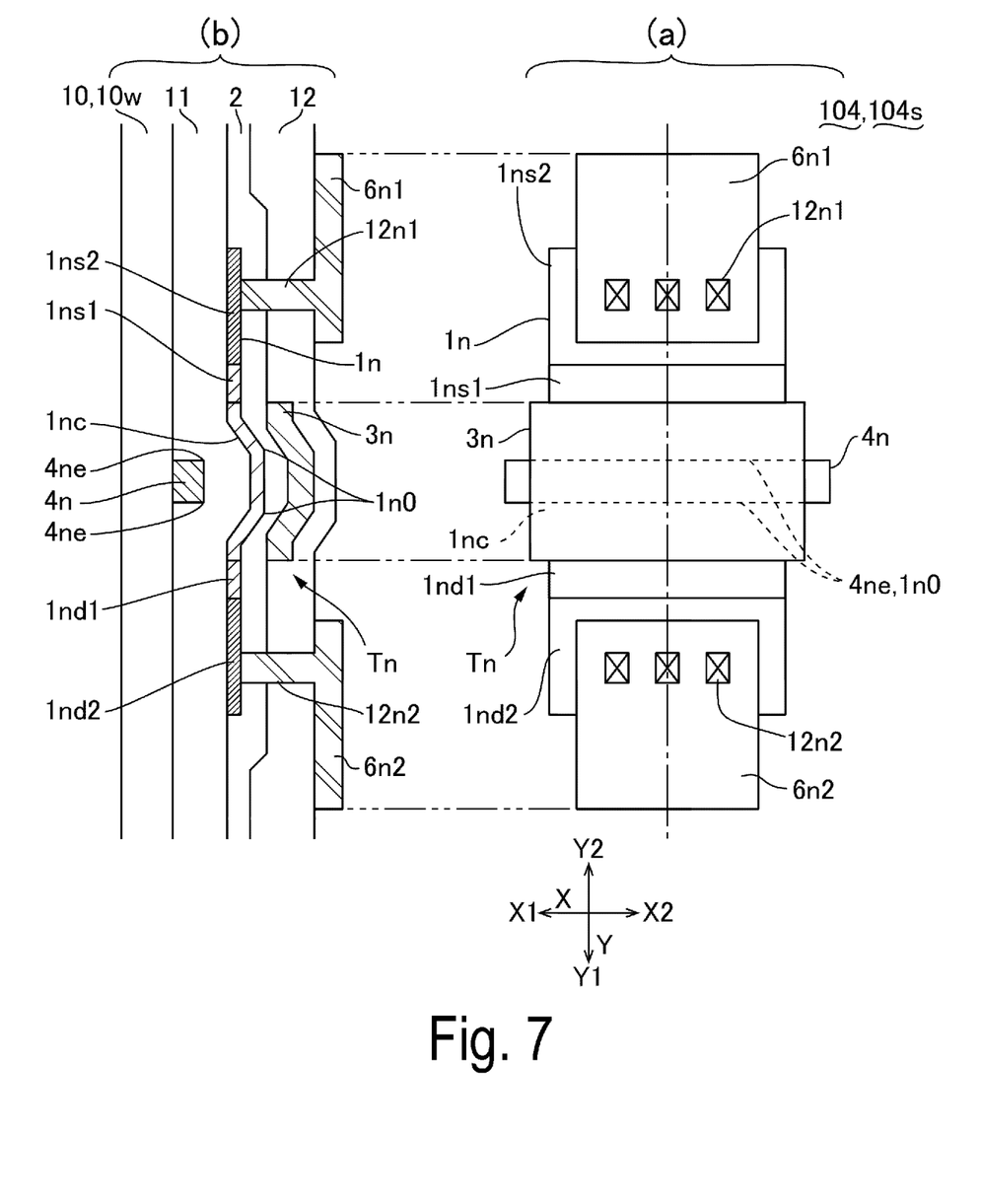
FIG. 7 is an explanatory view of an N-channel type transistor (first transistor) formed in a scan line drive circuit of an electro-optical device according to Exemplary Embodiment 2 of the disclosure.

FIG. 7 is an explanatory view of an N-channel type transistor Tn (first transistor) formed in a scan line drive circuit 104 of an electro-optical device 100 of Exemplary Embodiment 2, and FIG. 7 illustrates a plan view (a) of the N-channel type transistor Tn (first transistor) on the right side, and a cross-sectional diagram (b) of the N-channel type transistor Tn (first transistor) on the left side. Furthermore, since a basic configuration of this mode is similar to Exemplary Embodiment 1, common parts are given identical reference signs, and description of the common parts will be omitted.

In Exemplary Embodiment 1, when the step part 1n0 is formed in the semiconductor layer 1n, the slit 4ns is formed in the light-shielding layer 4n. However, in this mode, as illustrated in FIG. 7, a light-shielding layer 4n extends in a belt shape in a channel width direction in a region overlapping a channel region 1nc in planer view. Therefore, a shape of each of both end portions 4ne in a channel length direction of the light-shielding layer 4n is reflected as step part 1n0 in a semiconductor layer 1n via an insulating layer 11, and as a result, the step part 1n0 is arranged in parallel in two columns in the channel length direction in the channel region 1nc.

In one mode, as with Exemplary Embodiment 1, a pitch in a Y direction of unit circuits 104e or the like in a scan line drive circuit 104 is equal to a pitch P of scan lines 3a connected to the scan line drive circuit 104 (scan line drive circuit 104s). Furthermore, the N-channel type transistor Tn has a channel length less than or equal to 2 μm in planer view. Here, a width of the light-shielding layer 4n overlapping the channel region 1nc is greater than or equal to 1 μm. Accordingly, the N-channel type transistor Tn has a channel length less than or equal to 2 μm in planer view, but since the channel region 1nc is curved in a thickness direction by the steps parts 1n0 formed by the slit 4ns, a real dimension of the channel length is greater than 2 μm. For example, when the width of the light-shielding layer 4ns overlapping the channel region 1nc is 1 μm, a real channel length of the channel region 1nc increases by 0.23 to 0.25 μm.

Exemplary Embodiment 3

Figure 8:
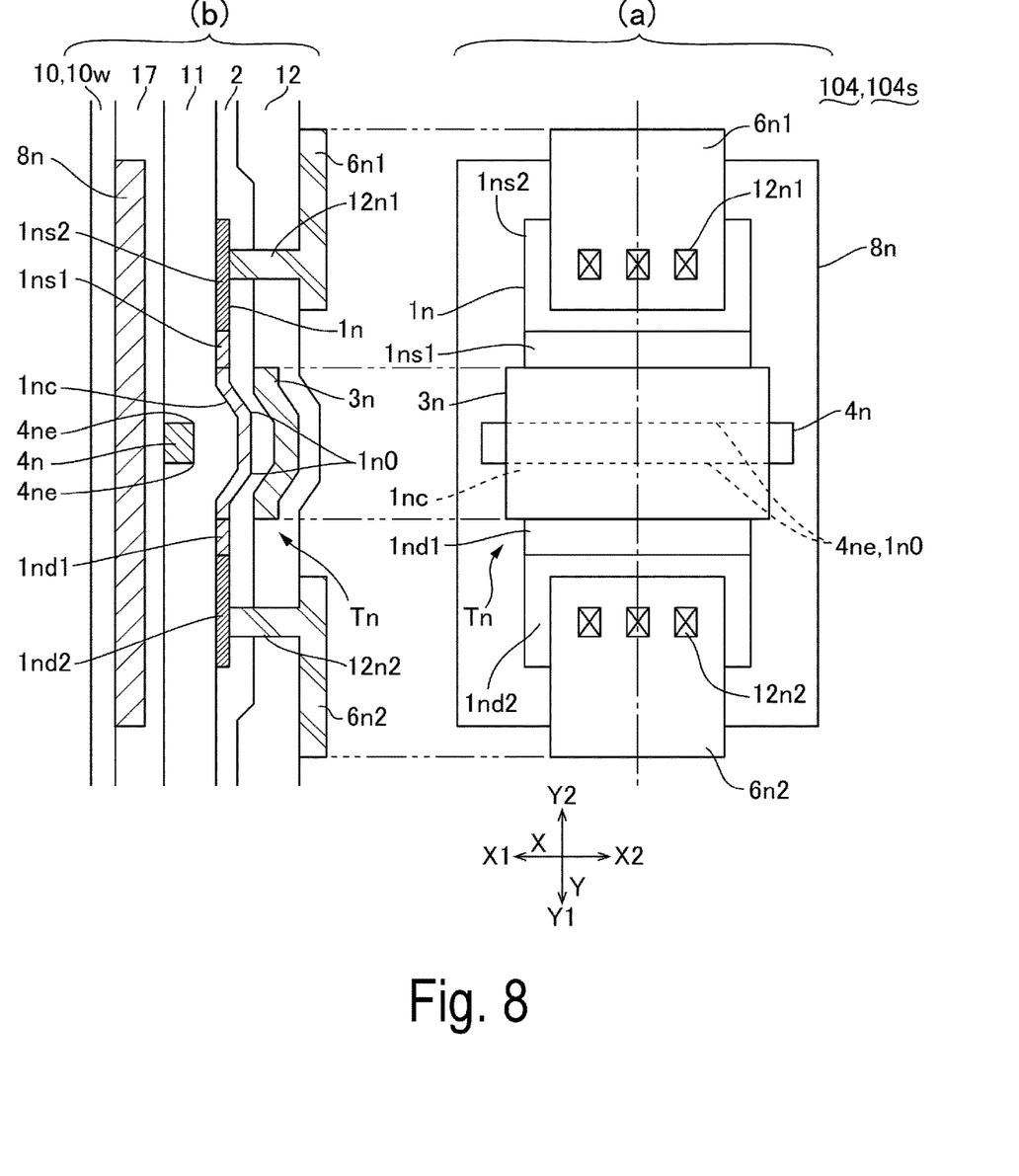
FIG. 8 is an explanatory view of an N-channel type transistor (first transistor) formed in a scan line drive circuit of an electro-optical device according to Exemplary Embodiment 3 of the disclosure.

FIG. 8 is an explanatory view of an N-channel type transistor Tn (first transistor) formed in a scan line drive circuit 104 of an electro-optical device 100 of Exemplary Embodiment 3, and FIG. 8 illustrates a plan view (a) of the N-channel type transistor Tn (first transistor) on the right side, and a cross-sectional diagram (b) of the N-channel type transistor Tn (first transistor) on the left side. Furthermore, since a basic configuration of this mode is similar to Exemplary Embodiment 1, common parts are given identical reference signs, and description of the common parts will be omitted.

In each of Exemplary Embodiments 1 and 2, the light-shielding layer 4n is provided in the region partially overlapping the semiconductor layer 1n. However, as illustrated in FIG. 8, a lower layer side insulating layer 17 may be formed between a light-shielding layer 4n and a first substrate 10, and a lower layer side light-shielding layer 8n may be formed between the lower layer side insulating layer 17 and the first substrate 10 to entirely overlap a semiconductor layer 1n in planer view. According to such a configuration, since light is blocked by the lower layer side insulating layer 17 to prevent the light from entering the semiconductor layer 1n from the first substrate 10 side, malfunctioning of the N-channel type transistor Tn due to optical leakage current is suppressed. In the case of such a configuration, the lower layer side light-shielding layer is formed between the lower layer side insulating layer 17 and the first substrate 10 to overlap the semiconductor layer 1p of the P-channel type transistor Tp described with reference to FIG. 6 in planer view, and thus malfunctioning of the P-channel type transistor Tp due to optical leakage current is suppressed. Note that in FIG. 8, the lower layer side light-shielding layer 8n is provided in the configuration of Exemplary Embodiment 2, but the lower layer side light-shielding layer 8n may be provided in the configuration of Exemplary Embodiment 1.

Exemplary Embodiment 4

In each of the exemplary embodiments described above, the light-shielding layer is used in the N-channel type transistors Tn used in the unit circuits 104e of the scan line drive circuit 104 to increase a real dimension of the channel length. However, also in a data line drive circuit 101 (second peripheral circuit), when unit circuits (second unit circuits) such as a shift register and a sample hold circuit are provided along an X direction at a pitch identical to a pitch of data lines 6a, a channel length of each of N-channel type transistors Tn (third transistors) used in the unit circuits of the data line drive circuit 101 may be substantially increased by using the light-shielding layer described in each of Exemplary Embodiments 1, 2, and 3.

Furthermore, in each of the exemplary embodiments described above, since the first direction corresponds to the X direction, and the second direction corresponds to the Y direction, the scan line drive circuit 104 corresponds to the first peripheral circuit, and the data line drive circuit 101 corresponds to the second peripheral circuit. However, the first direction may correspond to the Y direction, and the second direction may correspond to the X direction. In such a case, the scan line drive circuit 104 corresponds to the second peripheral circuit, and the data line drive circuit 101 corresponds to the first peripheral circuit.

Other Exemplary Embodiments

The electro-optical device 100 of the disclosure is not limited to a VA mode liquid crystal device. For example, the disclosure may be applied to a case where the electro-optical device 100 is a TN (twisted nematic) mode or OCB (optically compensated bend) mode liquid crystal device. Furthermore, in the exemplary embodiments described above, a transmissive liquid crystal device is exemplified, but the disclosure may be applied to a reflective liquid crystal device. Further, the disclosure is not limited to a liquid crystal device, and may be applied to an organic electroluminescent display device or the like.

Installation Example to Electronic Apparatus

Figure 9:
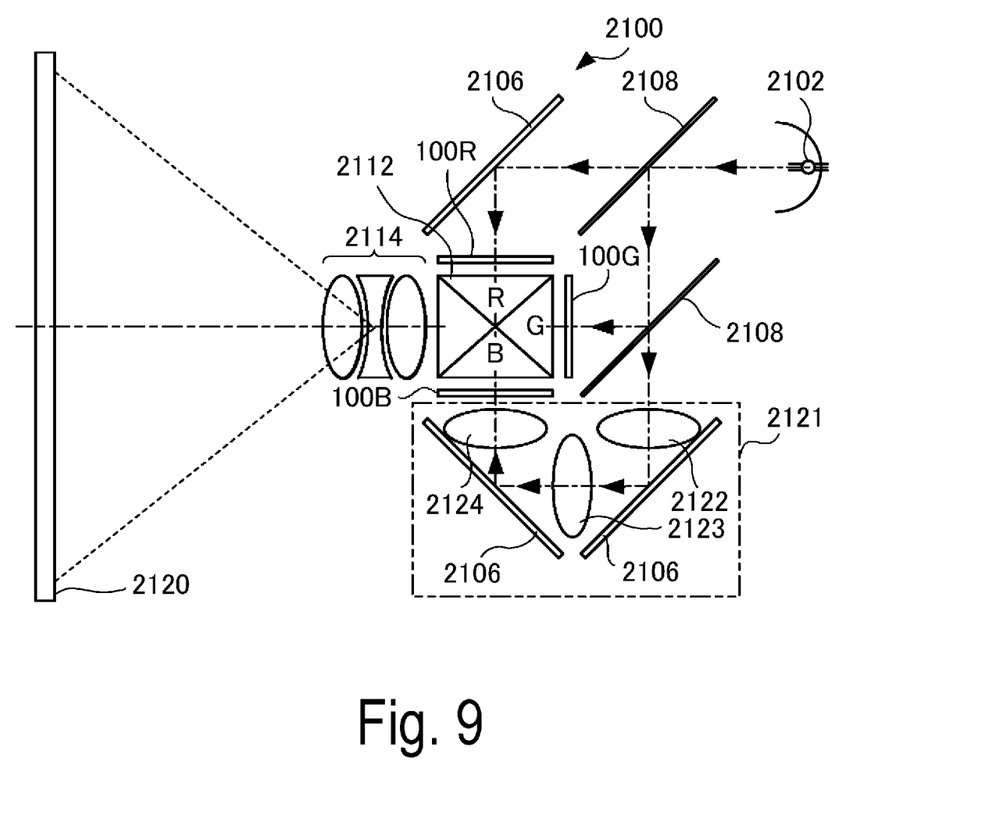
FIG. 9 is an explanatory view of a projection type display device (electronic apparatus) using an electro-optical device to which the disclosure is applied.

An electronic apparatus using the electro-optical device 100 of each of the exemplary embodiments described above will be described below. Here, a projection type display device (liquid crystal projector) will be described as an example of an electronic apparatus according to the disclosure. FIG. 9 is an explanatory view of a projection type display device (electronic apparatus) using the electro-optical device 100 to which the disclosure is applied. In a projection type display device 2100 illustrated in FIG. 9, the above-described electro-optical device 100 of a transmissive type is used as a light bulb. The projection type display device 2100 is provided with a lamp unit 2102 (light source unit) including a white light source such as a halogen lamp. Projection light emitted from the lamp unit 2102 is divided into light of three primary colors of R (red) color, G (green) color, and B (blue) color by three mirrors 2106 and two dichroic mirrors 2108 arranged inside. The divided projection light is guided to light bulbs 100R, 100G, and 100B corresponding to the respective primary colors. Note that since the B color light has an optical path greater than an optical path of the R color light or the G color light, the B color light is guided via a relay lens system 2121 including an incident lens 2122, a relay lens 2123, and an emission lens 2124 to prevent a loss of the B color light.

In the projection type display device 2100, three sets of liquid crystal devices each including the electro-optical device 100 are provided in correspondence with the R color, the G color, and the B color. The configuration of each of the light bulbs 100R, 100G, and 100B is similar to the configuration of the above-described electro-optical device 100 of a transmissive type. Light modulated by the light bulbs 100R, 100G, and 100B enters the dichroic prism 2112 in three directions, respectively. Then, in the dichroic prism 2112, the R color light and the B color light are reflected at 90 degrees, and the G color light transmits. Accordingly, after an image of the respective primary colors is composited, a color image is projected onto a screen 2120 by a projection lens group 2114 (projection optical system).

Other Projection Type Display Device

Note that a projection type display device may use, as a light source, an LED light source or the like configured to emit light of respective colors, and the light of respective colors emitted from such an LED light source may be supplied to another liquid crystal device.

Other Electronic Apparatus

An electronic apparatus including the electro-optical device 100 to which the disclosure is applied is not limited to the projection type display device 2100 of the exemplary embodiment described above. For example, the electronic apparatus including the electro-optical device 100 to which the disclosure is applied may be used for an electronic apparatus such as a projection type head-up display (HUD) or a direct-view type head-mounted display (HMD), a personal computer, a digital still camera, and a liquid crystal television.

This application claims priority to Japan Patent Application No. 2017-146222 filed Jul. 28, 2017, the entire disclosures of which are hereby incorporated by reference in their entireties.

What is claimed is:

1. An electro-optical device comprising:
   a substrate;
   a plurality of first signal lines extending along a first direction;
   a plurality of second signal lines extending along a second direction intersecting the first direction;
   a display region in which pixels are provided in correspondence with intersections between the plurality of first signal lines and the plurality of second signal lines; and
   a first peripheral circuit provided on one side in the first direction of the display region and including a plurality of first unit circuits that correspond to the plurality of first signal lines and are provided along the second direction at a pitch identical to pitches of the plurality of first signal lines, one of the first unit circuits including:
   a first transistor of a first conductivity type including a semiconductor layer, a gate insulating layer, and a gate electrode, the semiconductor layer including a first high concentration impurity introduction region, a first LDD region, a channel region, a second LDD region, and a second high concentration impurity introduction region;
   a second transistor of a second conductivity type including a semiconductor layer, a gate insulating layer, and a gate electrode,
   a first light-shielding layer provided between the substrate and the first transistor, the first light-shielding layer having an island shape such that the first light-shielding layer overlaps with the first high concentration impurity introduction region and the first LDD region in plan view, and
   a second light-shielding layer provided between the substrate and the first transistor, the second light-shielding layer having an island shape such that the second light-shielding layer overlaps with the second high concentration impurity introduction region and the second LDD region in plan view, wherein:
   the channel region includes (a) a first step extending in a channel width direction, the first step reflecting a shape of an end portion of the first light-shielding layer, and (b) a second step extending in the channel width direction, the second step reflecting a shape of an end portion of the second light shielding layer, and
   a light-shielding layer is not provided in an area between the substrate and the second transistor.

2. The electro-optical device according to claim 1, wherein
   each of the first unit circuits respectively includes the first transistor, and, in the plurality of first unit circuits, the plurality of first transistors are arranged along the first direction with a channel length direction facing a direction along the second direction.

3. The electro-optical device according to claim 2, wherein
   the plurality of first signal lines are each a scan line configured to transmit a scan signal, and
   the plurality of second signal lines are each a data line configured to transmit an image signal.

4. The electro-optical device according to claim 3, wherein
   in the semiconductor layer of at least one of the plurality of first transistors, impurity concentration of a first region adjacent in the second direction to the channel region is lower than impurity concentration of a second region adjacent to the first region on a side opposite to the channel region.

5. The electro-optical device according to claim 3, wherein
   each of the first unit circuits respectively includes the second transistor, and, in the plurality of first unit circuits, the plurality of second transistors each include an insulating layer, the semiconductor layer, the gate insulating layer, and the gate electrode laminated sequentially and are arranged together with the plurality of first transistors along the first direction with a channel length direction facing a direction along the second direction.

6. The electro-optical device according to claim 2, wherein
   in the semiconductor layer of at least one of the plurality of first transistors, impurity concentration in a first region adjacent in the second direction to the channel region is lower than impurity concentration in a second region adjacent to the first region on a side opposite to the channel region.

7. The electro-optical device according to claim 6, wherein
   each of the first unit circuits respectively includes the second transistor, and, in the plurality of first unit circuits, the plurality of second transistors each include an insulating layer, the semiconductor layer, the gate insulating layer, and the gate electrode laminated sequentially and are arranged together with the plurality of first transistors along the first direction with a channel length direction facing a direction along the second direction.

8. The electro-optical device according to claim 2, wherein
   each of the first unit circuits respectively includes the second transistor, and, in the plurality of first unit circuits, the plurality of second transistors each include an insulating layer, the semiconductor layer, the gate insulating layer, and the gate electrode laminated sequentially and are arranged together with the plurality of first transistors along the first direction, and a channel length direction of each of the plurality of second transistors of the second conductivity type is arranged with a direction along the second direction.

9. The electro-optical device according to claim 8, wherein
in the first peripheral circuit, a shift register includes the plurality of first transistors and the plurality of second transistors.

10. The electro-optical device according to claim 1, wherein
a pitch in the second direction of the plurality of first signal lines is less than or equal to 7 μm.

11. The electro-optical device according to claim 1, wherein
each of the first unit circuits respectively includes the first transistor, and, in at least one of the plurality of first transistors, a slit provided in a light-shielding layer extends in the channel width direction in a region overlapping the semiconductor layer in plan view, and the step part is arranged in parallel in the channel length direction to reflect a shape of each of both end portions in the channel length direction of the slit via an insulating layer.

12. The electro-optical device according to claim 11, wherein
the at least one of the plurality of first transistors has a channel length less than or equal to 2 μm in planer view, and a width of the slit overlapping the channel region is greater than or equal to 1 μm.

13. The electro-optical device according to claim 1, further comprising:
a second peripheral circuit provided on one side in the second direction of the display region and electrically connected to the plurality of second signal lines, wherein
in the second peripheral circuit, a plurality of second unit circuits corresponding to the plurality of second signal lines are provided along the first direction at a pitch identical to pitches of the plurality of second signal lines,
in the plurality of second unit circuits, a plurality of third transistors of a first conductivity type each including the semiconductor layer, the gate insulating layer, and the gate electrode are provided, and
among the plurality of third transistors, in at least one of the third transistors, a step part reflecting a shape of an end portion of a light-shielding layer via an insulating layer extends in the channel width direction in the channel region.

14. An electronic apparatus comprising the electro-optical device according to claim 1.

15. The electro-optical device according to claim 1, wherein
the first light-shielding layer and the second light-shielding layer are spaced apart from each other.

* * * * *